US010615760B2

(12) United States Patent
Kim

(10) Patent No.: US 10,615,760 B2
(45) Date of Patent: Apr. 7, 2020

(54) AUDIO OUTPUT SYSTEM AND CONTROL METHOD THEREOF

(71) Applicant: SAMSUNG ELECTRONICS CO., LTD., Suwon-si, Gyeonggi-do (KR)

(72) Inventor: Sung-yong Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/864,120

(22) Filed: Jan. 8, 2018

(65) Prior Publication Data

US 2018/0226931 A1 Aug. 9, 2018

(30) Foreign Application Priority Data

Feb. 6, 2017 (KR) ........................ 10-2017-0016106

(51) Int. Cl.
*H03G 3/30* (2006.01)
*H04R 3/12* (2006.01)
*H04S 7/00* (2006.01)

(52) U.S. Cl.
CPC ............. *H03G 3/3005* (2013.01); *H04R 3/12* (2013.01); *H04S 7/301* (2013.01);
(Continued)

(58) Field of Classification Search
CPC .... H03G 3/3005; H04R 3/12; H04R 2420/07; H04R 2430/01; H04S 7/301; H04S 2400/13
See application file for complete search history.

(56) References Cited

U.S. PATENT DOCUMENTS 8,917,888 B2 12/2014 Nakamura
9,431,985 B2 8/2016 Sanders
(Continued)

FOREIGN PATENT DOCUMENTS

CN 103250431 A 8/2013
CN 103718574 A 4/2014
(Continued)

OTHER PUBLICATIONS

Extended Search Report dated Jun. 11, 2018 in counterpart EuropeanPatent Application No. 18153526.1.
(Continued)

*Primary Examiner* — David L Ton
(74) *Attorney, Agent, or Firm* — Nixon & Vanderhye P.C.

(57) ABSTRACT

An audio output system is provided. The audio output system may include a first speaker device configured to output audio based on a first volume characteristic, and a second speaker device configured to output audio based on a second volume characteristic, wherein the first speaker device and the second speaker device may share device information with each other in response to the first speaker device and the second speaker device operating while being interlocked with each other, and the audio output system may be configured to identify a host speaker device which satisfies a predetermined condition based on the shared device information, and wherein the identified host speaker device may be configured to transmit at least one parameter which affects a volume characteristic of the host speaker device for a volume characteristic of another speaker device to be consistent with a volume characteristic of the host speaker device.

19 Claims, 12 Drawing Sheets

(52) U.S. Cl.
CPC ...... *H04R 2420/07* (2013.01); *H04R 2430/01* (2013.01); *H04S 2400/13* (2013.01)

(56) References Cited

U.S. PATENT DOCUMENTS

| | | | | |
|---|---|---|---|---|
| 2006/0104452 | A1 | 5/2006 | Park | |
| 2011/0289545 | A1* | 11/2011 | Eguchi ............. | H04N 21/43637 725/127 |
| 2012/0148075 | A1 | 6/2012 | Goh et al. | |
| 2013/0021531 | A1* | 1/2013 | Eguchi ............. | H04N 21/43637 348/723 |
| 2014/0294201 | A1 | 10/2014 | Johnson et al. | |
| 2014/0328506 | A1* | 11/2014 | Banks ...................... | H04R 5/02 381/303 |
| 2015/0063598 | A1* | 3/2015 | Shah ........................ | G08B 3/10 381/105 |
| 2015/0249890 | A1 | 9/2015 | Kim et al. | |

FOREIGN PATENT DOCUMENTS

| | | |
|---|---|---|
| JP | 2004-140531 | 5/2004 |
| JP | 2010-093403 | 4/2010 |
| KR | 10-2006-0043992 | 5/2006 |
| KR | 10-2006-0061656 | 6/2006 |
| KR | 10-2006-0081424 | 7/2006 |
| KR | 10-0611993 | 8/2006 |
| KR | 10-2007-0051140 | 5/2007 |
| KR | 10-1032521 | 5/2011 |
| KR | 10-1569257 | 11/2015 |
| WO | WO 2012/078111 | 6/2012 |

OTHER PUBLICATIONS

EP Examination Report issued for EP Application No. 18153526.1 dated Feb. 15, 2019.

Chinese Office Action dated Nov. 4, 2019 for CN Application No. 201810116408.3.

* cited by examiner

AUDIO OUTPUT SYSTEM AND CONTROL METHOD THEREOF

CROSS-REFERENCE TO RELATED APPLICATION

This application is based on and claims priority under 35 U.S.C. § 119 to Korean Patent Application No. 10-2017-0016106, filed in the Korean Intellectual Property Office on Feb. 6, 2017, the disclosure of which is incorporated by reference herein in its entirety.

BACKGROUND

1. Field

The present disclosure relates generally to an audio output system and a control method thereof, for example, to an audio output system which outputs sound based on a volume characteristic of another speaker device and a control method thereof.

2. Description of Related Art

In the past, in media and broadcasting, audio was provided through the first channel (mono) or the second channel (stereo), but a multi-channel audio of a 5.1 channel, etc. has been developed to provide realistic sounds by adding a three dimensional effect and realism.

In the case in which the speaker devices included in a multi-channel have different volume characteristics, a user perceives the sounds output through the speaker devices differently even though the sounds are output with the same volume. Accordingly, a user interface for calibrating the different volume characteristics is provided so that a user can adjust the balance of the volume.

However, if a volume characteristic is controlled using a user interface, it is inconvenient for a user to control a volume characteristic of a speaker device manually, and there could also be a problem that a user might control the volume characteristic out of a provided range.

Thus, there has emerged the need for the technique of controlling a plurality of speaker devices having different volume characteristics to output audio with the same or a similar volume characteristic without a manual control by a user.

SUMMARY

An aspect of example embodiments relates to an audio output system which outputs audio with a volume characteristic that is the same as or similar to the volume characteristic of a speaker device identified as a host speaker device, and a control method thereof.

According to an example embodiment, an audio output system is provided, the audio output system including a first speaker device configured to output audio based on a first volume characteristic and a second speaker device configured to output audio based on a second volume characteristic, wherein in response to the first speaker device and the second speaker device operating while being interlocked with each other, the first speaker device and the second speaker device may share device information with each other, and the audio output system may identify a host speaker device which satisfies a predetermined condition based on the shared device information, and wherein the identified host speaker device may transmit at least one parameter which affects a volume characteristic of the host speaker device for a volume characteristic of another speaker device to be consistent with a volume characteristic of the host speaker device.

The device information may be at least one of information of a type of a speaker device, an arrangement position of a speaker device, and a sound pressure level of a speaker device.

The host speaker device may be identified by comparing a type, a maximum sound pressure level, and an arrangement position of the first speaker device and the second speaker device in sequence.

The other speaker device may obtain a difference in a volume curve which indicates an amount of volume increase at each volume level of the host speaker device and the other speaker device using at least one parameter received from the host speaker device, and calibrate a volume curve of the other speaker device using the obtained difference.

The other speaker device may obtain a difference in output power at each volume level of the host speaker device and the other speaker device using at least one parameter received from the host speaker device, and calibrate output power of the other speaker device using the obtained difference.

If output power of the host speaker device is equal to or greater than maximum output power of the other speaker device, the other speaker device may calibrate output power of the other speaker device to maximum output power.

The other speaker device may obtain a difference in a sound pressure level of the host speaker device and the other speaker device at the same output power using at least one parameter received from the host speaker device, and calibrate a sound pressure level of the other speaker device using the obtained difference.

The at least one parameter may include at least one of a headroom, an input sensitivity, a maximum power level, a sound pressure level (SPL), a crossover frequency, a gain and a speaker device impedance.

The other speaker device may store at least one parameter which affects a volume characteristic of the other speaker device, and when the other speaker device operates independently from the host speaker device, the other speaker device may output audio according to a volume characteristic based on the at least one stored parameter.

The first speaker device may communicate with the second speaker device via wireless network.

A volume control method of an audio output system is provided, the method including, in response to a first speaker device configured to output audio based on a first volume characteristic and a second speaker device configured to output audio based on a second volume characteristic operating while being interlocked with each other, sharing device information of the first speaker device and the second speaker device by the first speaker device and the second speaker device; and determining a host speaker device which satisfies a predetermined condition based on the shared device information, wherein the identified host speaker device may transmit at least one parameter which affects a volume characteristic of the host speaker device for a volume characteristic of another speaker device to be consistent with a volume characteristic of the host speaker device.

The device information may be at least one of information of a type of a speaker device, an arrangement position of a speaker device, and a sound pressure level of a speaker device.

The host speaker device may be identified by comparing a type, a maximum sound pressure level, and an arrangement position of the first speaker device and the second speaker device in sequence.

The other speaker device may obtain a difference in a volume curve which indicates an amount of volume increase at each volume level of the host speaker device and the other speaker device using at least one parameter received from the host speaker device, and calibrate a volume curve of the other speaker device using the obtained difference.

The other speaker device may obtain a difference in output power at each volume level of the host speaker device and the other speaker device using at least one parameter received from the host speaker device, and calibrate output power of the other speaker device using the obtained difference.

If output power of the host speaker device is equal to or greater than maximum output power of the other speaker device, the other speaker device may calibrate output power of the other speaker device to maximum output power.

The other speaker device may obtain a difference in a sound pressure level of the host speaker device and the other speaker device at the same output power using at least one parameter received from the host speaker device, and calibrate a sound pressure level of the other speaker device using the obtained difference.

The at least one parameter may include at least one of a headroom, an input sensitivity, a maximum power level, a sound pressure level (SPL), a crossover frequency, a gain and a speaker device impedance.

The other speaker device may store at least one of parameter which affects a volume characteristic of the other speaker device, and when the other speaker device operates independently from the host speaker device, the other speaker device may output audio according to a volume characteristic based on the at least one stored parameter.

The first speaker device may communicate with the second speaker device via wireless network.

BRIEF DESCRIPTION OF THE DRAWINGS

The above and/or other aspects, features and attendant advantages of the present disclosure will be more apparent and readily appreciated from the following detailed description, taken in conjunction with the accompanying drawings, in which like reference numerals refer to like elements, and wherein.

DETAILED DESCRIPTION

Figure 1:
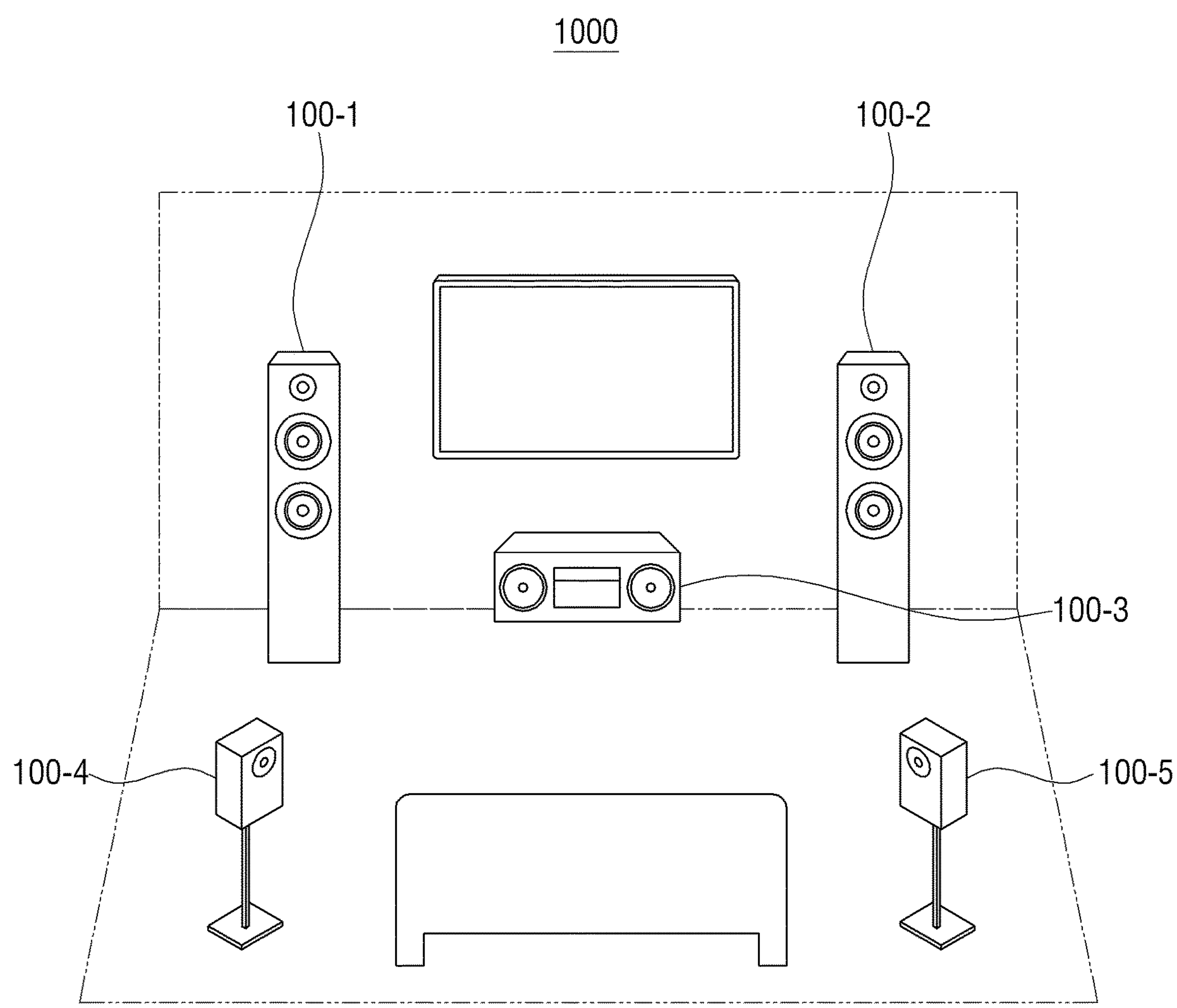
FIGS. 1 and 2 are diagrams illustrating an example audio output system including a plurality of speaker devices according to an example embodiment of the present disclosure.

Hereinafter, the terms used in the description will be described briefly and various example embodiments will be described in greater detail.

Although the terms used in the various example embodiments are general terms, which are widely used in the present time considering the functions in the present disclosure, the terms may be changed depending on an intention of a person skilled in the art, a precedent, and introduction of new technology. With respect to the terms used in an example embodiment of the disclosure, general terms currently widely used are selected in view of function with respect to the disclosure; however, the terms may vary according to an intention of a technician practicing in the pertinent art, an advent of new technology, etc. In specific cases, terms may be chosen arbitrarily, and in this case, definitions thereof will be described in the description of the corresponding disclosure.

The example embodiments may vary, and may be provided in different example embodiments. Various example embodiments will be described with reference to accompanying drawings. However, this does not necessarily limit the scope of the example embodiments to a specific embodiment form. Instead, modifications, equivalents, alternatives and replacements included in the disclosed concept and technical scope of this disclosure may be employed. While describing example embodiments, if it is identified that the description regarding a known technology obscures the gist of the disclosure, a detailed description thereof may be omitted.

In the present disclosure, relational terms such as first and second, and the like, may be used to distinguish one entity from another entity, without necessarily implying any actual relationship or order between such entities.

A singular term includes a plural form unless it is intentionally written that way. The terms, "include," "comprise," "is configured to," etc. of the description are used to indicate the existence of features, numbers, steps, operations, elements, parts or combination thereof, and do not exclude the possibilities of combination or addition of one or more features, numbers, steps, operations, elements, parts or combination thereof.

In an example embodiment, 'a module' or 'a unit' may perform at least one function or operation, and may be realized as hardware (e.g., circuitry), firmware, software, or any combination thereof. In addition, a plurality of 'modules' or a plurality of 'units' may be integrated into at least one module and may be realized as at least one processor (not shown) except for 'modules' or 'units' that should be realized in a specific hardware.

The example embodiments of the disclosure will be described in greater detail below in a manner that will be understood by one of ordinary skill in the art. However, the example embodiments may be implemented in various different forms, and are not limited to the example embodiments described herein. Also, well-known functions or constructions may not described in detail if they would obscure the disclosure with unnecessary detail, and throughout the specification, similar reference numerals are used for similar elements.

Hereinafter, various example embodiments will be described in greater detail with reference to the accompanying drawings.

FIG. 1 is a diagram illustrating an example audio output system including a plurality of speaker devices in accordance with an example embodiment of the present disclosure.

Referring to FIG. 1, according to an example embodiment, an audio output system 1000 may include a plurality of speaker devices 100-1, 100-2, 100-3, 100-4, and 100-5. The plurality of speaker devices 100-1, 100-2, 100-3, 100-4, and 100-5 may be connected to the same network or operate while being interlocked with one another or operate independently.

For example, the audio output system 1000 may include front speaker devices 100-1 and 100-2 which are arranged on the left and right in the front side of a user, a center speaker device 100-3 which is arranged between the front speaker devices, and rear speaker devices 100-4 and 100-5 which are arranged on the left and right in the rear side of a user.

The audio output system 1000 may identify one speaker device which satisfies a predetermined condition as a host speaker device from among the plurality of speaker devices 100-1, 100-2, 100-3, 100-4, and 100-5, and the remaining speaker devices may be identified as slave speaker devices. The host speaker device may be a speaker device of which the volume characteristic is the reference volume characteristic among the plurality of speaker devices 100-1, 100-2, 100-3, 100-4, and 100-5, and the host speaker device may have a better volume characteristic, such as a more optimized sound pressure, etc. compared to another speaker device. The slave speaker device may calibrate a volume characteristic of the slave speaker device to be consistent with a volume characteristic of a host speaker device, and the slave speaker device may have a rather low volume characteristic compared to the volume characteristic of a host speaker device. Calibrating a volume characteristic to be consistent with a volume characteristic of a host speaker device may refer to calibrating the volume characteristic of a slave speaker device to be the same as or similar to a volume characteristic of a host speaker device. In addition, calibrating a volume characteristic to be consistent with the volume characteristic of the host device may refer, for example, to calibrating a volume characteristic to be similar to the volume characteristic of a host speaker device may not necessarily refer to calibrating a volume characteristic of a slave speaker device to be perfectly the same as the volume characteristic of a host speaker device, but may refer, for example, to calibrating a part of section in the entire volume level section or calibrating a volume characteristic such that a difference from the volume characteristic of a host speaker device can be reduced.

The method for determining a host speaker device will be described in greater detail below with reference to FIGS. 5, 6 and 7.

The host speaker device among the plurality of speaker devices 100-1, 100-2, 100-3, 100-4, and 100-5 may transmit the volume characteristic information of the host speaker device to the slave speaker devices. The volume characteristic information may be at least one parameter which affects a volume characteristic.

The slave speaker device which receives the volume characteristic information from the host speaker device may calibrate the volume characteristic using at least one parameter which is pre-stored in relation to the information of the unique volume characteristic of the slave speaker device and the received volume characteristic information of the host speaker device. Also, the slave speaker device may output audio in accordance with the calibrated volume characteristic. The method for calibrating the volume characteristic information will be described in greater detail below with reference to FIGS. 8A, 8B and 9A and 9B.

The elements of the audio output system 1000 may be added or excluded in accordance with the purpose of use of a user. For example, if a user wants to use the system to listen to music, a reproduction device for reproducing music may be added to the audio output system 1000, and the center speaker device 100-3 which is not suitable for listening to music may be excluded. If a user wants to use the system to view an image or video, the audio output system 1000 may include the speaker device provided in a display apparatus, and the display apparatus may be regarded as one of a plurality of speaker devices in the audio output system 1000. If a user wants to use the system to watch a movie, such as watching a movie using a home theater, the audio output system 1000 may further include a display apparatus, an image reproducing device such as a DVD player, a surround speaker device, a woofer, or the like.

Figure 2:
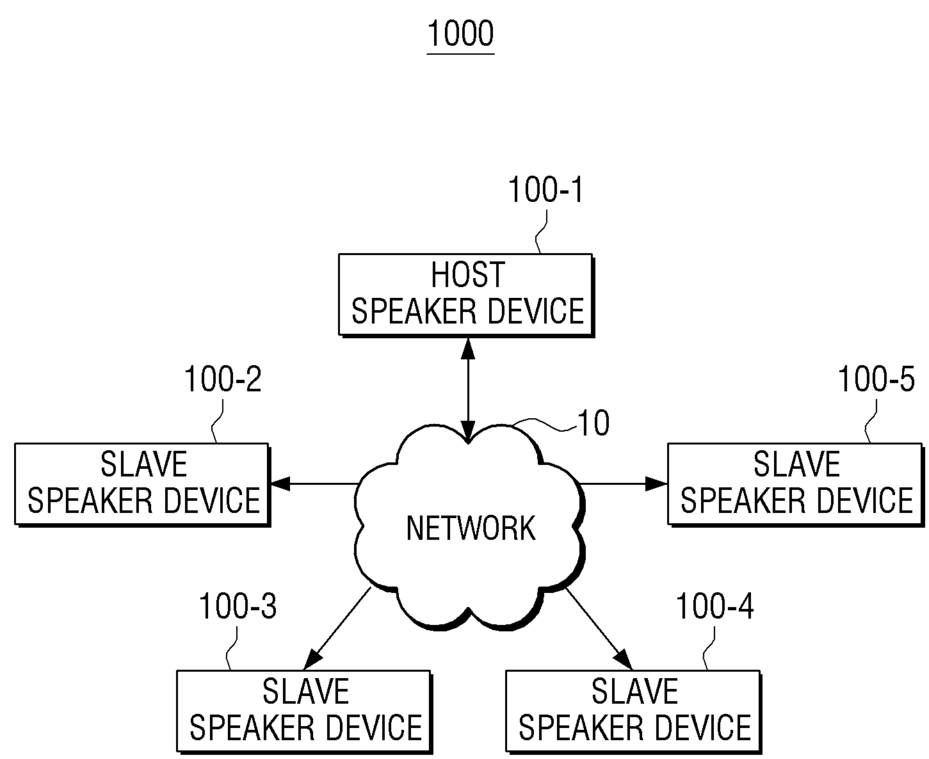

FIG. 2 is a diagram illustrating an example audio output system including a plurality of speaker devices in accordance with an example embodiment of the present disclosure.

Referring to FIG. 2, according to an example embodiment, the audio output system 1000 may include a plurality of speaker devices 100-1, 100-2, 100-3, 100-4, and 100-5. The plurality of speaker devices 100-1, 100-2, 100-3, 100-4, and 100-5 may be connected via a network 10. The network 10 may, for example, and without limitation, be a wireless communication method such as Wi-Fi, Bluetooth, or the like, or a wired communication method using cable, or the like.

For example, the plurality of speaker devices 100-1, 100-2, 100-3, 100-4, and 100-5 may include a host speaker device 100-1 and a plurality of slave speaker devices 100-2, 100-3, 100-4 and 100-5. The host speaker device 100-1 may be a speaker device which satisfies a predetermined condition among the plurality of speaker devices 100-1, 100-2, 100-3, 100-4, and 100-5.

The plurality of speaker devices 100-1, 100-2, 100-3, 100-4, and 100-5 may share the device information of the speaker devices with one another, and identify the speaker device which satisfies a predetermined condition as a host speaker device 100-1 based on the shared device information. The device information may include, for example, and without limitation, at least one of the information of a type, information of an arrangement position, and information of a sound pressure of each of the plurality of speaker devices 100-1, 100-2, 100-3, 100-4, and 100-5. For example, the plurality of speaker devices 100-1, 100-2, 100-3, 100-4, and 100-5 may sequentially compare, for example, and without limitation, a type, a maximum sound pressure level and an arrangement position of each of the plurality of speaker devices 100-1, 100-2, 100-3, 100-4, and 100-5 at each volume level, and identify a host speaker device 100-1. The method for determining a host speaker device will be described in greater detail below with reference to FIGS. 5 and 7.

The device information may not only include the information of a sound pressure level, but further include at least one parameter which affects a volume characteristic such as, for example, and without limitation, a headroom, an input sensitivity, a maximum power level, a crossover frequency, a gain and a speaker device impedance, or the like. In this case, the plurality of speaker devices 100-1, 100-2, 100-3, 100-4, and 100-5 may identify a speaker device with the best volume characteristic as a host speaker device using at least one parameter value shared among the plurality of speaker devices 100-1, 100-2, 100-3, 100-4, and 100-5.

In the above description, it has been described that the plurality of speaker devices 100-1, 100-2, 100-3, 100-4, and 100-5 may share the device information with one another and identify the host speaker device 100-1 based on the shared device information, but the example embodiments are not limited thereto. In an example embodiment, the electronic apparatus which receives all the device information of the plurality of speaker devices 100-1, 100-2, 100-3, 100-4, and 100-5 may identify the host speaker device 100-1 which satisfies a predetermined condition. For example, a reproduction device which communicates with all the plurality of speaker devices 100-1, 100-2, 100-3, 100-4, and 100-5 may identify the host speaker device 100-1 based on the device information of the plurality of speaker devices 100-1, 100-2, 100-3, 100-4, and 100-5.

The host speaker device 100-1 may transmit at least one parameter which affects the first volume characteristic that is the unique volume characteristic of the host speaker device 100-1 to the plurality of slave speaker devices 100-2, 100-3, 100-3, and 100-4 which are connected via the network 10. For example, if the host speaker device 100-1 operates while being interlocked with the plurality of slave speaker devices 100-2, 100-3, 100-4, and 100-5, the host speaker device 100-1 may transmit at least one first parameter to the slave speaker devices 100-2, 100-3, 100-4, and 100-5 for at least one of the volume characteristics of the slave speaker devices 100-2, 100-3, 100-4, and 100-5 to be consistent with the volume characteristic of the host speaker device 100-1. Meanwhile, before determining a host speaker device, if a plurality of parameters which affect a volume characteristic are included in the shared device information, the process in which the host speaker device 100-1 transmits the first parameter to the plurality of slave speaker devices 100-2, 100-3, 100-4, and 100-5 may be skipped.

The volume characteristic may be a unique characteristic of speaker devices, and it may refer, for example, to the characteristic of sound strength (volume) which becomes different depending on at least one parameter of a speaker device. For example, when the volume is adjusted, the volume characteristic may refer, for example, to the amount of volume change depending on the changes in a volume level, or may refer, for example, to the volume output at the time when output power is supplied. The volume characteristic may become different depending on the size or the efficiency of a speaker device.

The volume characteristic may be affected by at least one parameter.

The parameter may, for example, and without limitation, be at least one of a headroom, a headroom, an input sensitivity, a maximum power level, a sound pressure level (SPL), a crossover frequency, a gain and a speaker device impedance.

The headroom may refer, for example, to the difference between a peak level and a root mean square level of an audio signal, and generally, the higher the headroom is, the greater the strength and the fluctuation of sound are. The input sensitivity may refer, for example, to the input voltage required for a certain audio device to produce a rated output, and the lower the required input voltage is, the higher the input sensitivity is. The sound pressure level may, for example, indicate the strength of sound represented as a sound pressure, and the sound pressure may be the decibel value of the ratio obtained by comparison to a reference sound pressure. With respect to the crossover frequency, as it is difficult to reproduce all the registers of an audible frequency by one full-range speaker device, the registers may be divided into two ways or more than two ways from a low register to a high register, and the divided registers may be allocated to a plurality of speaker devices and each of the plurality of speaker devices may reproduce the corresponding divided register. The crossover frequency may refer, for example, to the boundary frequency between the divided registers. The gain may, for example, indicate the amplified level of an input voltage signal, and the gain may be the value obtained by comparing an output level with an input level or a reference level, and the gain may be represented in decibels in general. The speaker device impedance may be inversely proportional to the output of an amplifier, and if the impedance of a speaker device is low, the output of an amplifier may increase, and the speaker device impedance may change depending on a reproduced frequency band.

The operation that the speaker devices operate while being interlocked may refer, for example, to the operation that an audio reproduction command is input while the network 10 is connected, or that an audio reproduction command is input while the plurality of speaker devices 100-1, 100-2, 100-3, 100-4, and 100-5 connected to the network 10 are grouped by a user selection.

Each of the plurality of slave speaker devices 100-2, 100-3, 100-4, and 100-5 may have a predetermined second volume characteristic, and may store at least one second parameter which affects the predetermined unique second volume characteristic. Accordingly, if each of the plurality of slave speaker devices 100-2, 100-3, 100-4, and 100-5 operates independently from another speaker device, the slave speaker devices may output audio in accordance with each of the predetermined second volume characteristic. Also, even if each of the plurality of slave speaker devices 100-2, 100-3, 100-4, and 100-5 are connected with another speaker device via the same network 10, the slave speaker devices may operate independently if the slave speaker devices are not interlocked with the other speaker device.

If the plurality of slave speaker devices 100-2, 100-3, 100-4, and 100-5 operate while being interlocked with the host speaker device 100-1 and another speaker device, each of the plurality of slave speaker devices 100-2, 100-3, 100-4, and 100-5 may receive at least one first parameter from the host speaker device 100-1 via the network 10.

Each of the plurality of slave speaker devices 100-2, 100-3, 100-4, and 100-5 may calibrate the predetermined second volume characteristic using at least one of the received first parameters of the host speaker device 100-1. For example, each of the plurality of slave speaker devices 100-2, 100-3, 100-4, and 100-5 may calibrate the predetermined second volume characteristic to be consistent with the first volume characteristic of the host speaker device 100-1 using at least one of the pre-stored unique second parameter and at least one of the received parameters of the host speaker device 100-1.

For example, the plurality of slave speaker devices 100-2, 100-3, 100-4, and 100-5 may calibrate each of the volume curves of the speaker devices to be consistent with the volume curve of the host speaker device 100-1. The volume curve may, for example, indicate the amount of volume changes in response to the changes in volume level. For example, if the volume level of each of the plurality of slave speaker devices 100-2, 100-3, 100-4, and 100-5 is increased by three levels at the same volume level as the volume level of the host speaker device 100-1, the amount of increase in output volume of the speaker devices may become consistent. The amount of volume increase may be identified by the difference in decibel of output audio. The method for increasing a volume curve will be described in greater detail below with reference to FIGS. 8A and 8B.

Each of the plurality of slave speaker devices 100-2, 100-3, 100-4, and 100-5 may calibrate the output power of the speaker devices to be consistent with the output power of the host speaker device 100-1. For example, each of the plurality of slave speaker devices 100-2, 100-3, 100-4, and 100-5 may calibrate the output power using an input sensitivity, a gain and a speaker device impedance which are pre-stored, and may also use an input sensitivity, a gain and a speaker device impedance of the host speaker device 100-1 which are received from the host speaker device 100-1. The output power may refer to the level of power to be output at the same volume level as the volume level of the host speaker device 100-1.

At the higher volume level at which the output power of the host speaker device 100-1 is greater than the maximum output power of each of the plurality of slave speaker devices 100-2, 100-3, 100-4, and 100-5, each of the plurality of slave speaker devices 100-2, 100-3, 100-4, and 100-5 may calibrate the output power of the speaker devices to the maximum. The method for calibrating output power will be described in greater detail below with reference to FIGS. 9A and 9B.

Each of the plurality of slave speaker devices 100-2, 100-3, 100-4, and 100-5 may calibrate the sound pressure level of the speaker devices to be consistent with the sound pressure level of the host speaker device 100-1. For example, if the output power level of each of the plurality of slave speaker devices 100-2, 100-3, 100-4, and 100-5 is the same as the output power level of the host speaker device 100-1, each of the slave speaker devices may calibrate the sound pressure level to be consistent with the sound pressure level of the host speaker device 100-1.

Each of the plurality of slave speaker devices 100-2, 100-3, 100-4, and 100-5 may output audio in accordance with the calibrated volume characteristic.

In the above description, it is described that four slave speaker devices are provided for ease of description, but it will be understood that the slave speaker devices may be three or less than three, or five or more than five.

Also, although it has not been described, an audio signal providing device, such as, for example, and without limitation, may be a PC, a tablet PC, an mp3, a laptop, a TV, or the like, which provides an audio signal to be output from the plurality of speaker devices 100-1, 100-2, 100-3, 100-4 and 100-5 and may be connected to the network 10. The audio signal provided from the audio signal providing device may be transmitted to each of the plurality of speaker devices 100-1, 100-2, 100-3, 100-4 and 100-5 via the network 10

If only the host speaker device 100-1 is provided with an audio signal, the host speaker device 100-1 may transmit the audio signal to each of the plurality of slave speaker devices 100-2, 100-3, 100-4, and 100-5 via the network 10.

Meanwhile, even if the volume characteristic of each of the plurality of slave speaker devices 100-2, 100-3, 100-4, and 100-5 is calibrated to be similar to the volume characteristic of the host speaker device 100-1, an additional calibration may be performed by a user manipulation. In this case, the user may further calibrate the volume characteristic of each of the plurality of slave speaker devices 100-2, 100-3, 100-4, and 100-5 using an interface such as, for example, and without limitation, a touch screen which is provided in each of the plurality of slave speaker devices 100-2, 100-3, 100-4, and 100-5, or a display apparatus (not illustrated) included in the audio output system 1000.

As described above, by calibrating a volume characteristic of a slave speaker device to be consistent with a volume characteristic of a host speaker device using at least one parameter received from a host speaker device, which affects a volume characteristic, the balance among the plurality of speaker devices may be achieved without a manual control by a user, and even if a new speaker device is added, the existing speaker devices may be compatible without changing the settings of the speaker devices, and accordingly, user convenience may improve.

Figure 3:
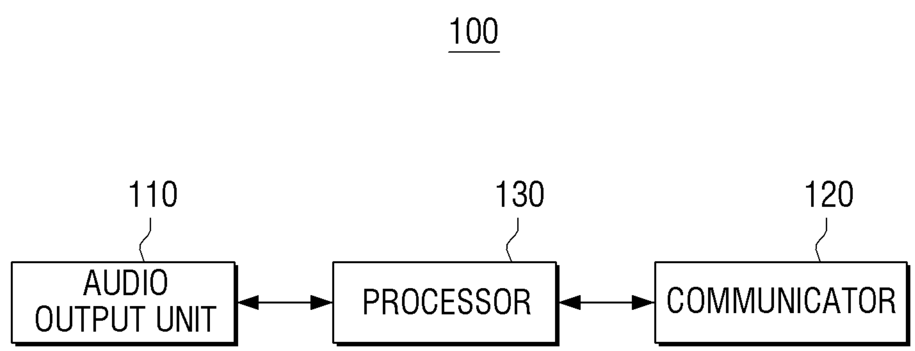
FIG. 3 is a block diagram illustrating an example configuration of a speaker device included in an audio output system according to an example embodiment of the present disclosure.

FIG. 3 is a block diagram illustrating an example configuration of a speaker device included in an audio output system according to an example embodiment of the present disclosure.

Referring to FIG. 3, the speaker device 100 may include an audio output unit (e.g., including audio output circuitry) 110, a communicator (e.g., including communication circuitry) 120 and a processor (e.g., including processing circuitry) 130.

The audio output unit 110 may include various audio output circuitry and be configured to output audio (sound). The audio output unit 110 may output a processed audio signal in accordance with a unique volume characteristic of the speaker device 100. The unique volume characteristic of the speaker device may be affected by at least one pre-stored parameter, and the parameter may, for example, and without limitation, be at least one of a headroom, an input sensitivity, a maximum power level, a sound pressure level (SPL), a crossover frequency, a gain and a speaker device impedance. Once the volume characteristic is calibrated, the audio output unit 110 may output audio based on the calibrated volume characteristic.

The communicator 120 may include various communication circuitry and be configured to transmit and receive data to and from another speaker device. For example, if the speaker device 100 is a host speaker device, the host speaker device may transmit at least one pre-stored parameter to another speaker device. The other speaker device may be connected via network, or may be grouped with the speaker device 100. There may be a plurality of the other speaker devices.

If the speaker device 100 is a slave speaker device, the slave speaker device may receive from the other speaker device at least one parameter of the other speaker device, which is a host speaker device. The at least one received parameter may affect the volume characteristic of the host speaker device.

The communicator 120 may transmit and receive data to and from the other speaker device via cable or wirelessly. For example, the communicator 120 may transmit and receive data to and from the other speaker device by a wireless communication method such as, for example, and without limitation, Wi-Fi, Bluetooth, or the like, or by a wired communication using cable, or the like. If the other speaker device is connected by a wired communication method, a host speaker device may be connected with each of slave speaker devices, or at least one slave speaker device may be sequentially connected with the host speaker device. The data may include at least one parameter, an audio output command and an audio signal to be output, etc.

The processor 130 may include various processing circuitry and control the audio output unit 110 to output audio. For example, the processor 130 may control the audio output unit 110 to output audio in accordance with the volume characteristic of the speaker device 100. The volume characteristic may be affected by at least one parameter.

If the speaker device 100 is a host speaker device, the processor 130 may control the audio output unit 110 to output audio in accordance with a unique volume characteristic based on at least one pre-stored parameter. If a command for operating the speaker device 100 while the speaker device 100 is interlocked with the other speaker device is input, the processor 130 may control the communicator 120 to transmit at least one pre-stored parameter to the other speaker device which operates while being interlocked with the speaker device 100. The processor 130 may also control the communicator 120 to transmit to the other speaker device an output command, an audio signal to be output, etc. along with the parameter.

If the speaker device 100 is a slave speaker device, the processor 130 may, for example, and without limitation, perform the below operations.

For example, the processor 130 may control the audio output unit 100 to output audio in accordance with a unique volume characteristic based on at least one pre-stored parameter. If a command for operating the speaker device 100 while the speaker device 100 is interlocked with the other speaker device is input, the processor 130 may control the communicator 120 to receive at least one parameter which affects the volume characteristic of a host speaker device from the host speaker device, which is identified as a host speaker device by satisfying a predetermined condition.

The processor 130 may calibrate the volume characteristic of the speaker device 100 using at least one received parameter of the host speaker device, and control the audio output unit 110 to output audio in accordance with the calibrated volume characteristic. For example, the processor 130 may calibrate the unique volume characteristic of the speaker device 100 to be consistent with the volume characteristic of the host speaker device using at least one received parameter of the host speaker device and at least one pre-stored parameter which affects the unique volume characteristic of the speaker device 100.

The processor 130 may calculate (obtain) the difference between a volume curve of the host speaker device and a volume curve of the speaker device 100, and calibrate the volume curve of the speaker device 100 using the calculated (obtained) difference. The volume curve may indicate the volume increase at each volume level, and may refer to the amount of volume change in response to the change in volume level. For example, the processor 130 may calibrate a gain of the speaker device 100 for the volume curve of the speaker device to be consistent with the volume curve of the host speaker device.

The processor 130 may calibrate the output power at each volume level of the speaker device 100. The processor 130 may calibrate the volume curve to be consistent with the volume curve of the host speaker device, and calibrate the output power at each volume level of the speaker device 100. The volume curve calibration will be described in greater detail below with reference to FIGS. 8A and 8B.

For example, the processor 130 may obtain the difference in output power of the host speaker device and the speaker device 100 at each volume level, and calibrate the output power of the speaker device 100 at each volume level using the obtained difference. When the processor 130 calculates the difference, the processor may set the volume level of the host speaker device as the same as the volume level of the speaker device 100 and obtain the difference in output power at the same volume level. The processor 130 may also adjust the output power of the speaker device 100 and calibrate the output power to be consistent with the output power of the host speaker device.

If the output power of the host speaker device is equal to or greater than the maximum output power of the speaker device 100 at the same volume level, the processor 130 may calibrate the output power of the speaker device 100 to be maximum at the corresponding volume level. The output power calibration will be described in greater detail below with reference to FIGS. 9A and 9B.

The processor 130 may calibrate a sound pressure level of the speaker device 100. When the processor 130 calibrates the sound pressure level, the processor 130 may calibrate the output power at each volume level to be consistent with the output power of the host speaker device, and calibrate the sound pressure level of the speaker device 100. The processor 130 may set the output power of the host speaker device as the same as the output power of the speaker device 100 and obtain the difference in output power at the same output power level, and calibrate the sound pressure level of the speaker device 100 to be consistent with the sound pressure level of the host speaker device.

If the speaker device 100 operates independently from the host speaker device, the processor 130 may output audio in accordance with the unique volume characteristic of the speaker device 100 based on at least one pre-stored parameter. For example, if the grouping of the speaker devices is released or the network is disconnected while the speaker device 100 outputs audio in accordance with the calibrated volume characteristic or while the speaker device 100 operates while being interlocked with the other speaker device (s), the processor 130 may control the audio output unit 110 to output the audio in accordance with the unique volume characteristic.

As described above, by calibrating a volume characteristic of a speaker device to be consistent with the volume characteristic of a host speaker device using at least one parameter which affects a volume characteristic received from a host speaker device, the balance among the plurality of speaker devices may be achieved without a manual control by a user, and even if a new speaker device is added, the existing speaker devices may be compatible without changing the settings of the speaker devices, and accordingly, user convenience may improve.

Figure 4:
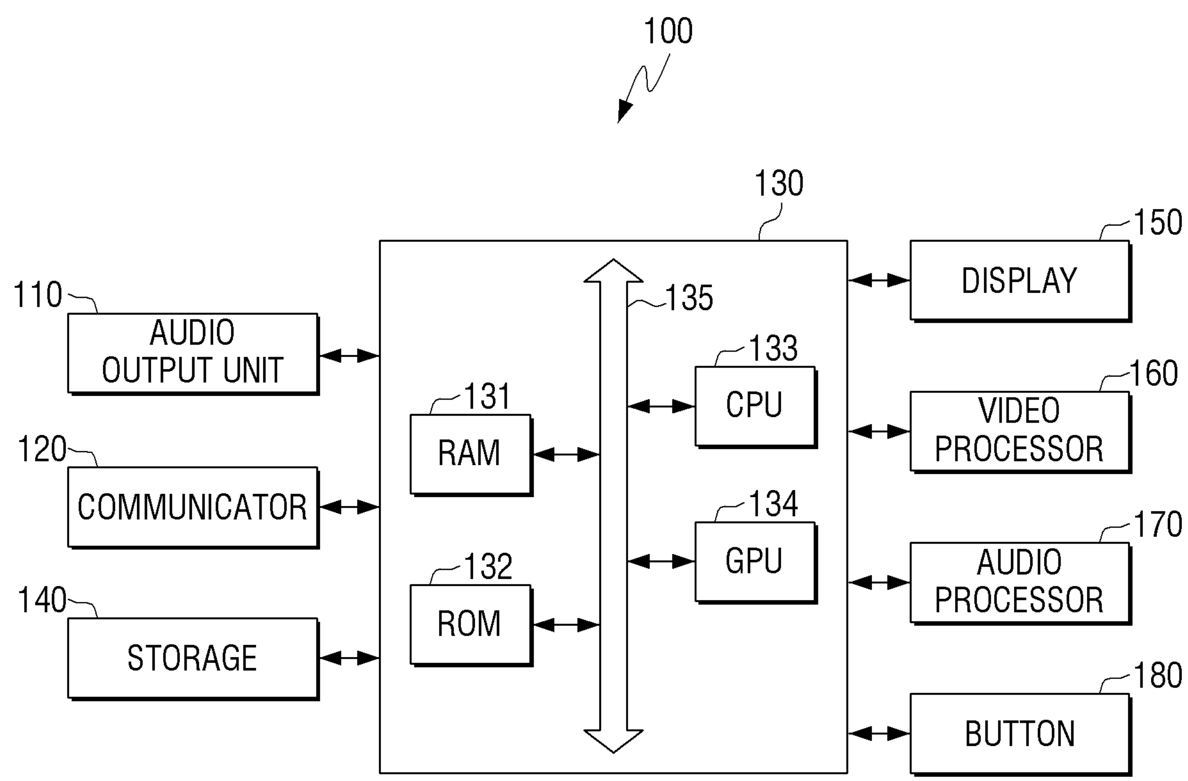
FIG. 4 is a block diagram illustrating the speaker device illustrated in FIG. 3.

FIG. 4 is a block diagram illustrating the speaker device illustrated in FIG. 3 in greater detail.

Referring to FIG. 4, the speaker device 100 may include the audio output unit (e.g., including audio output circuitry) 110, communicator (e.g., including communication circuitry) 120, a processor (e.g., including processing circuitry) 130, a storage 140, a display 150, a video processor (e.g., including video processing circuitry) 160, an audio processor (e.g., including audio processing circuitry) 170, and a button 180.

The operations of the audio output unit 110, the communicator 120, and the processor 130 may be the same as illustrated in FIG. 3, and thus, the descriptions for the operations will not be repeated.

The storage 140 may store various programs and data required for operating the speaker device 100. For example, if the display 150 is provided in the speaker device 100, the storage 140 may store programs and data for creating a variety of Uls which provide a user interface window displayed on the display 150. The storage 140 may also store at least one predetermined parameter which affects a volume characteristic of the speaker device 100. The volume characteristic of the speaker device 100 may be the unique volume characteristic of the speaker device 100. Also, the storage 140 may store at least one parameter which affects the volume characteristic of a host speaker device, which is received via the communicator 120.

If the display 150 is provided in the speaker device 100, the processor 130 may display a user interface window on the display 150 using the programs and data stored in the storage 140. Also, when a manipulation command is input by a user, the processor 130 may perform the operation corresponding to the manipulation command. For example, if the display 150 is a touch screen, the processor 130 may perform the operation which corresponds to a user's touch on a certain area of the user interface window displayed on the display 150. Meanwhile, a user may directly manipulate the speaker device 100 using a remote controller, or the like, and may input a manipulation command through a separate display which is connected with the speaker device 100. In this case, the processor 130 may perform the operation corresponding to the user manipulation command input through the communicator 120.

The processor 130 may include, for example, and without limitation, a RAM 131, a ROM 132, a CPU 133, a graphic processing unit (GPU) 134, and a bus 135. The RAM 131, the ROM 132, the CPU 133, and the graphic processing unit 134 may be connected via the bus 135.

The CPU 133 may access to the storage 140 and perform booting using the 0/S stored in the storage 140, and perform various operations using the programs, content and data stored in the storage 140.

The ROM 132 may store a command word set, etc. for booting a system. Once a turn-on command is input and power is supplied, the CPU 133 may copy the 0/S stored in the storage 140 to the RAM 131 in accordance with a command word stored in the ROM 132, and may boot a system by executing the 0/S. Once the booting is completed, the CPU 133 may copy various programs stored in the storage 140 to the RAM 131, and execute the program copied to the RAM 131 and perform various operations.

Once the booting of the speaker device 100 is completed, the GPU 134 may display a UI on the display 150. For example, the GPU 134 may generate the screen including various objects such as an icon, an image, text, etc. using a calculation unit (not illustrated) and a rendering unit (not illustrated). A calculation unit may obtain an attribute value such as a coordinate value, a shape, a size, a color, etc. with which each object is displayed conforming to the layout of the screen. The rendering unit may generate a screen with a variety of layouts which includes an object based on the attribute value obtained by the calculation unit. The screen (or a user interface window) generated in a rendering unit may be provided to the display 150, and displayed on a main display area and a sub display area.

The display 150 may display the information of the speaker device 100, and display a user interface window for receiving an input of a user adjustment manipulation. For example, the display 150 may display a user interface window for receiving an input of a volume adjustment manipulation. The display 150 may be implemented as various forms of displays such as, for example, and without limitation, a liquid crystal display (LCD), an organic light emitting diodes display (OLED), a plasma display panel (PDP), or the like. The display 120 may also include a driving circuit which may be implemented as a-si TFT, low temperature poly silicon (LTPS), TFT, organic TFT (OTFT), or the like, and a backlight unit, etc. The display 120 may also be implemented as a flexible display.

The display 150 may be disposed at a small area of the speaker device 100, or may be disposed on a large area of the front side of the speaker device 100. In the case in which the display 150 is disposed on the front side of the speaker device 100, the example of the speaker device 100 may, for example, and without limitation, be a PC, a tablet PC, a laptop, a TV, or the like. If a user wants to watch a movie, the display 150 may display an image signal which is processed by a video processor 160.

If the display 150 is provided in the speaker device 100, the video processor 160 may include various video processing circuitry and be configured to process the content received via the communicator 120 or the video data included in the content stored in the storage 140. The video processor 160 may perform various image-processing operations such as decoding, scaling, noise-filtering, a frame rate conversion, a resolution conversion, etc.

The audio processor 170 may include various audio processing circuitry and be configured to process the content received via the communicator 120 or the audio data included in the content stored in the storage 140. The audio processor 170 may perform various processing operations to audio data, such as, for example, and without limitation, decoding, amplifying, noise-filtering, or the like. Also, the audio output unit 110 may output sounds of audio data processed by the audio processor 170.

The button 180 may be various forms of buttons such as, for example, and without limitation, a mechanical button, a touchpad, and a wheel formed on some areas such as the front, the side, and the rear of the exterior of a main body of the speaker device 100, or the like. The button 180 may include a volume control button which is disposed on at least one of the front, the side and the rear of the exterior of a main body and is able to adjust the volume, and a control button for selecting, reproducing, stopping, pausing, etc. a music which a user wants to play.

Depending on the form of the speaker device 100, the speaker device 100 may further include a microphone, a photographing unit, a GPS chip, etc., or may not include the display 150, the video processor 130, the GPU 134, and the button 180, etc.

Figure 5:
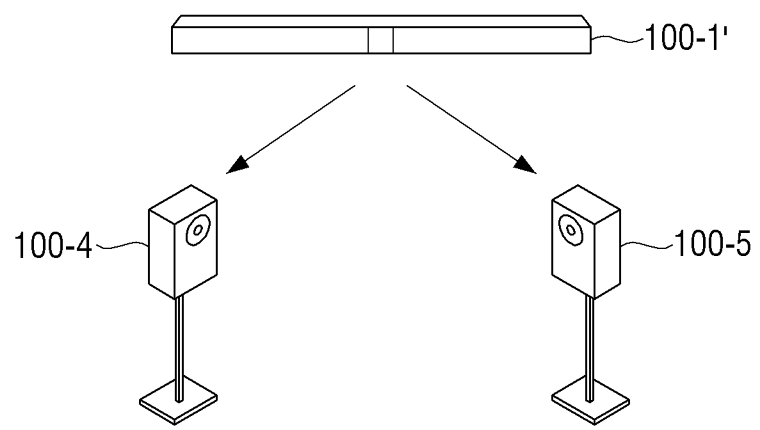
FIGS. 5, 6 and 7 are diagrams illustrating an example determination method of a host speaker device according to various example embodiments of the present disclosure.
Figure 6:
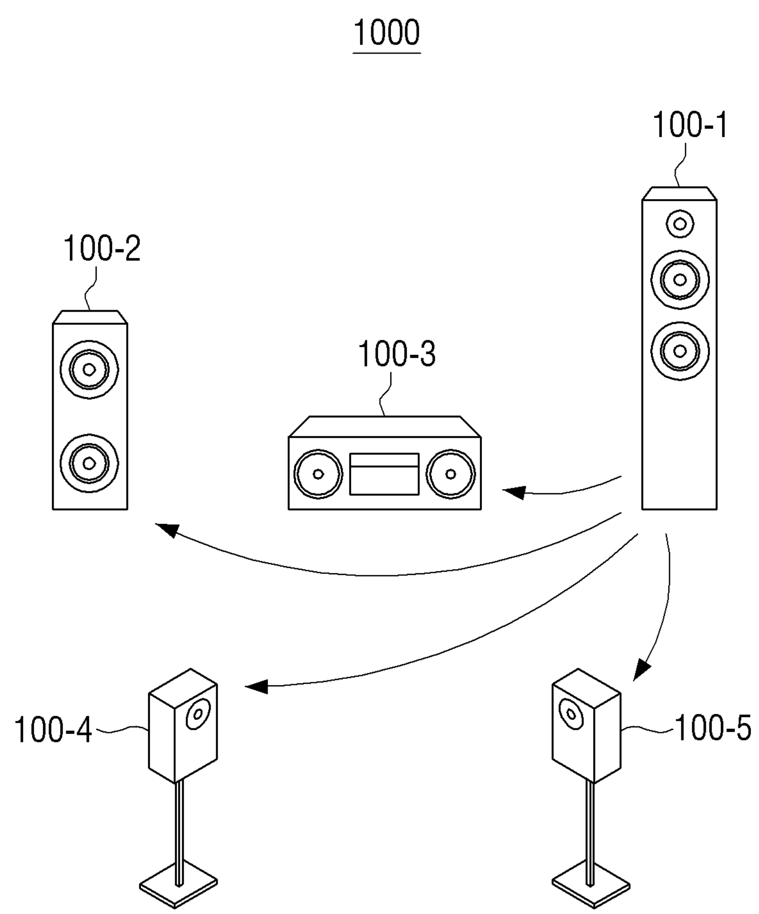
Figure 7:
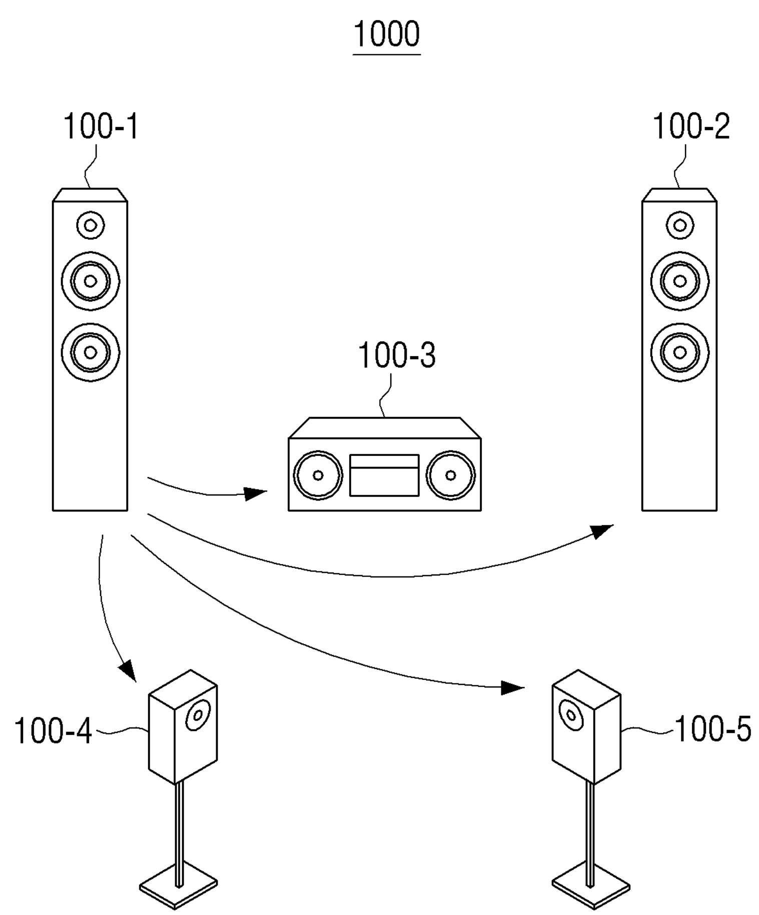

FIGS. 5, 6 and 7 are diagrams illustrating an example method for determining a host speaker device according to various example embodiments of the present disclosure. For example, the host speaker device 100-1 of the audio output system 1000 may be identified by sequentially comparing a type, a maximum volume level, and an arrangement position of each of a plurality of speaker devices 100-1, 100-2, 100-3, 100-4, and 100-5 which operate while being interlocked with one another at each volume level. For example, if one of the plurality of speaker devices 100-1, 100-2, 100-3, 100-4, and 100-5 which operates while being interlocked with one another is a sound bar, the host speaker device 100-1 may be a sound bar 100-1', and if the plurality of speaker devices 100-1, 100-2, 100-3, 100-4, and 100-5 are not a sound bar but a different type of speaker device, the host speaker device 100-1 may be the speaker device with the highest sound pressure level. If the plurality of speaker devices 100-1, 100-2, 100-3, 100-4, and 100-5 are not a sound bar but the same type of speaker device, the host speaker device 100-1 may be a front speaker device. If there are a plurality of front speaker devices, the host speaker device 100-1 may be a left speaker device among the plurality of front speaker devices.

For example, according to FIG. 5, the audio output system 1000 may include the sound bar 100-1' and a plurality of rear speaker devices 100-4 and 100-5.

The sound bar 100-1' may, for example, be a long, bar-shaped speaker device, and may be implemented as one speaker device in which the front speaker devices arranged on the left and right sides on the front of a user and a center speaker device arranged between the front speaker devices are integrated. The sound bar 100-1' may further include a woofer and a sub-woofer, and may realize the three dimensional sounds using a reflection angle of sounds.

If the sound bar 100-1' is included in the audio output system 100, the sound bar 100-1' may be identified as a host speaker device, and the sound bar 100-1' may transmit at least one parameter related to a volume characteristic to a plurality of rear speaker devices 100-4 and 100-5, which are slave speaker devices.

Each of the plurality of rear speaker devices 100-4 and 100-5 may receive at least one parameter from the sound bar 100-1,' and calibrate the volume characteristic to be consistent with the volume characteristic of the sound bar 100-1.'

FIGS. 6 and 7 illustrate an example embodiment in which an audio output system 1000 does not include a sound bar.

According to FIG. 6, the audio output system 1000 may include a plurality of front speaker devices 100-1 and 100-2, a center speaker device 100-3 and a plurality of rear speaker devices 100-4 and 100-5. Generally, the front speaker device may have a better volume characteristic than the volume characteristics of the center speaker device and the rear speaker device, and accordingly, one of the front speaker devices may be identified as a host speaker device.

According to an example embodiment, the left front speaker device 100-2 and the right front speaker device 100-1 may be different types of speaker devices. In this case, the front speaker device with a better volume characteristic from among the different types of the front speaker devices may be identified as a host speaker device. For example, the host speaker device may be identified based on a sound pressure level, an efficiency, etc.

As illustrated in FIG. 6, if the sound pressure level of the right front speaker device 100-1 is higher than the sound pressure level of the left front speaker device 100-2, the right front speaker device 100-1 may be identified as a host speaker device.

The right front speaker device 100-1 identified as a host speaker device may transmit at least one parameter related to the volume characteristic to the left front speaker device 100-2, the center speaker device 100-3 and the plurality of rear speaker devices 100-4 and 100-5, which are the slave speaker devices.

Each of the left front speaker device 100-2, the center speaker device 100-3 and the plurality of rear speaker devices 100-4 and 100-5 may receive one parameter from the right front speaker device 100-1, and calibrate the volume characteristic to be consistent with the volume characteristic of the right front speaker device 100-1.

FIG. 6 illustrates that the size of the right front speaker device 100-1 may be larger than the size of the left front speaker device 100-2 to indicate that the type of right front speaker device 100-1 is different from the type of the left front speaker device 100-2, but the example embodiments are not limited thereto. The speaker device with a better volume characteristic may be identified as a host speaker device even if the size of the speaker device is smaller than the size of the other speaker device.

According to FIG. 7, the audio output system 1000 may include a plurality of front speaker devices 100-1 and 100-2, a center speaker device 100-3 and a plurality of rear speaker devices 100-4 and 100-5. Generally, the front speaker device may have a better volume characteristic than the volume characteristics of the center speaker device and the rear speaker device, and accordingly, one of the front speaker devices may be identified as a host speaker device.

According to an example embodiment, the left front speaker device 100-2 and the right front speaker device 100-1 may be the same type of speaker devices. In this case, the front speaker device arranged on the left side may be identified as a host speaker device, but the example embodiments are not limited thereto. The front speaker device arranged on the right side may also be identified as a host speaker device.

As illustrated in FIG. 7, between the same type of the front speaker devices 100-1 and 100-2, the left front speaker device 100-1 arranged on the left side may be identified as a host speaker device.

The left front speaker device 100-1 identified as a host speaker device may transmit at least one parameter related to a volume characteristic to the right front speaker device 100-2, the center speaker device 100-3, and the plurality of rear speaker devices 100-4 and 100-5, which are slave speaker devices.

Each of the right front speaker device 100-2, the center speaker device 100-3, and the plurality of rear speaker devices 100-4 and 100-5 may receive at least one parameter from the right front speaker device 100-1, and calibrate the volume characteristic to be consistent with the volume characteristic of the left front speaker device 100-1.

As described above, by determining the speaker device with the best volume characteristic as a host speaker device, sharing at least one parameter received from a host speaker device, which affects the volume characteristic, and calibrating the volume characteristics of the slave speaker devices to be consistent with the volume characteristic of the host speaker device, the balance among the plurality of speaker devices may be achieved without a manual control by a user, and even if a new speaker device is added, the existing speaker devices may be compatible without changing the settings of the speaker devices, and accordingly, user convenience may improve.

Figure 8A:
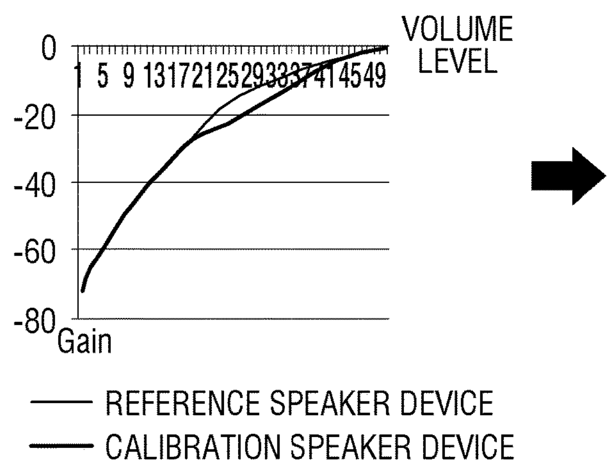
FIGS. 8A and 8B are diagrams illustrating an example of calibrating a volume characteristic by a volume curve calibration according to various example embodiments of the present disclosure.
Figure 8B:
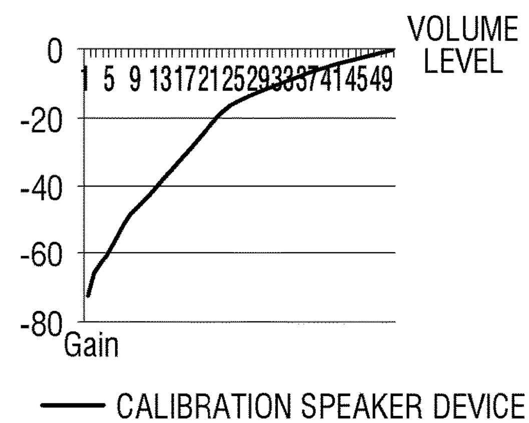

FIGS. 8A and 8B are diagrams illustrating an example of calibrating a volume characteristic by calibrating a volume curve according various example embodiments of the present disclosure.

A speaker device may obtain the difference between the volume curve of the speaker device and the volume curve of the host speaker device using at least one predetermined parameter and at least one parameter received from a host speaker device. The volume curve may indicate the amount of volume change in response to the changes in volume level, and may be measured based on the changes in gain depending on the changes in volume level.

Referring to FIG. 8A, there may be a difference between the volume curve of the host speaker device, which is a reference speaker device, and the volume curve of the speaker device, which is a calibration speaker device.

For example, if the volume level is between 0 and 17, the volume curve of the reference speaker device may be similar to the volume curve of the calibration speaker device, but if the volume level is between 17 and 45, the amount of the volume increase of the calibration speaker device in response to the increase in volume level may be relatively lower than the amount of volume increase of the reference speaker device.

Accordingly, the speaker device may compare the gain value of the host speaker device with the gain value of the speaker device, and calibrate the gain value at the volume level between 17 and 45 of the speaker device, which is the calibration speaker device, for the volume curve of the speaker device to be consistent with the volume curve of the host speaker device, which is the reference speaker device. FIG. 8B illustrates an example volume curve of the calibration speaker device.

Figure 9A:
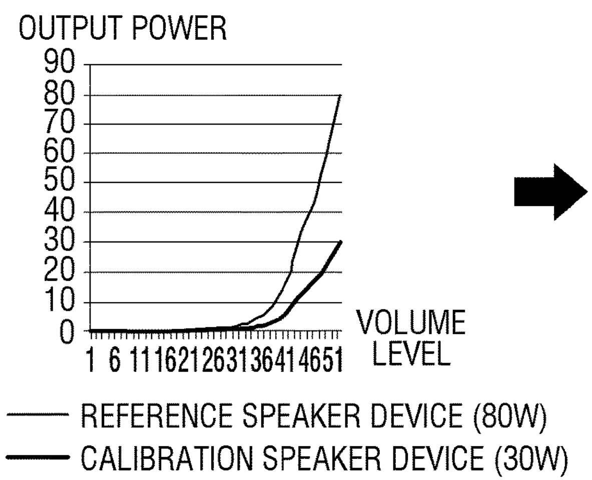
FIGS. 9A and 9B are diagrams illustrating an example of calibrating a volume characteristic by a output power calibration according to various example embodiments of the present disclosure.
Figure 9B:
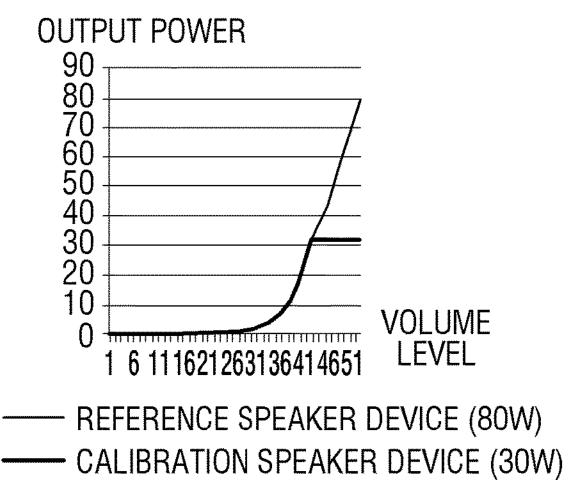

FIGS. 9A and 9B are diagrams illustrating an example of calibrating a volume characteristic by calibrating output power according to various example embodiments of the present disclosure.

The speaker device may obtain the difference between the output power of the speaker device and the output power of the host speaker device using at least one predetermined parameter and at least one parameter received from a host speaker device. The speaker device may obtain the difference by comparing the output power of the speaker device with the output power of the host speaker device at the same volume level.

Referring to FIG. 9A, if the maximum output power of the host speaker device, which is a reference speaker device, is 80 W, and the maximum output power of the speaker device, which is the calibration speaker device, is 30 W, there may be a difference in output power at each volume level. For example, as there is the difference in the maximum output power, the difference in output power at the same volume level may become large when the volume level increases.

Accordingly, the speaker device may compare the output power value of the host speaker device with the output power value of the speaker device, and as illustrated in FIG. 9A, the speaker device may increase the output power of the speaker device, which is the calibration speaker device, to be consistent with the output power of the host speaker device, which is the reference speaker device.

According to an example embodiment, the speaker device may obtain the calibration value of output power based on the equation as follows:

$$\text{a calibration value} = \text{an input sensitivity of a speaker device (dB)} - \text{an input sensitivity of a host speaker (dB)} + \log = \frac{\text{output power of a host speaker (W)}}{\text{output power of a speaker (W)}} \qquad \text{Equation}$$

According to FIG. 9B, the maximum output power of the speaker device, which is the calibration speaker device, may be 30 W, and at the volume level higher than around 42, the output power of the host speaker device, which is the reference speaker device, may increase more than the maximum output power of the speaker device, and accordingly, the speaker device may calibrate the output power to be maintained at maximum at the volume level higher than 42.

Figure 10:
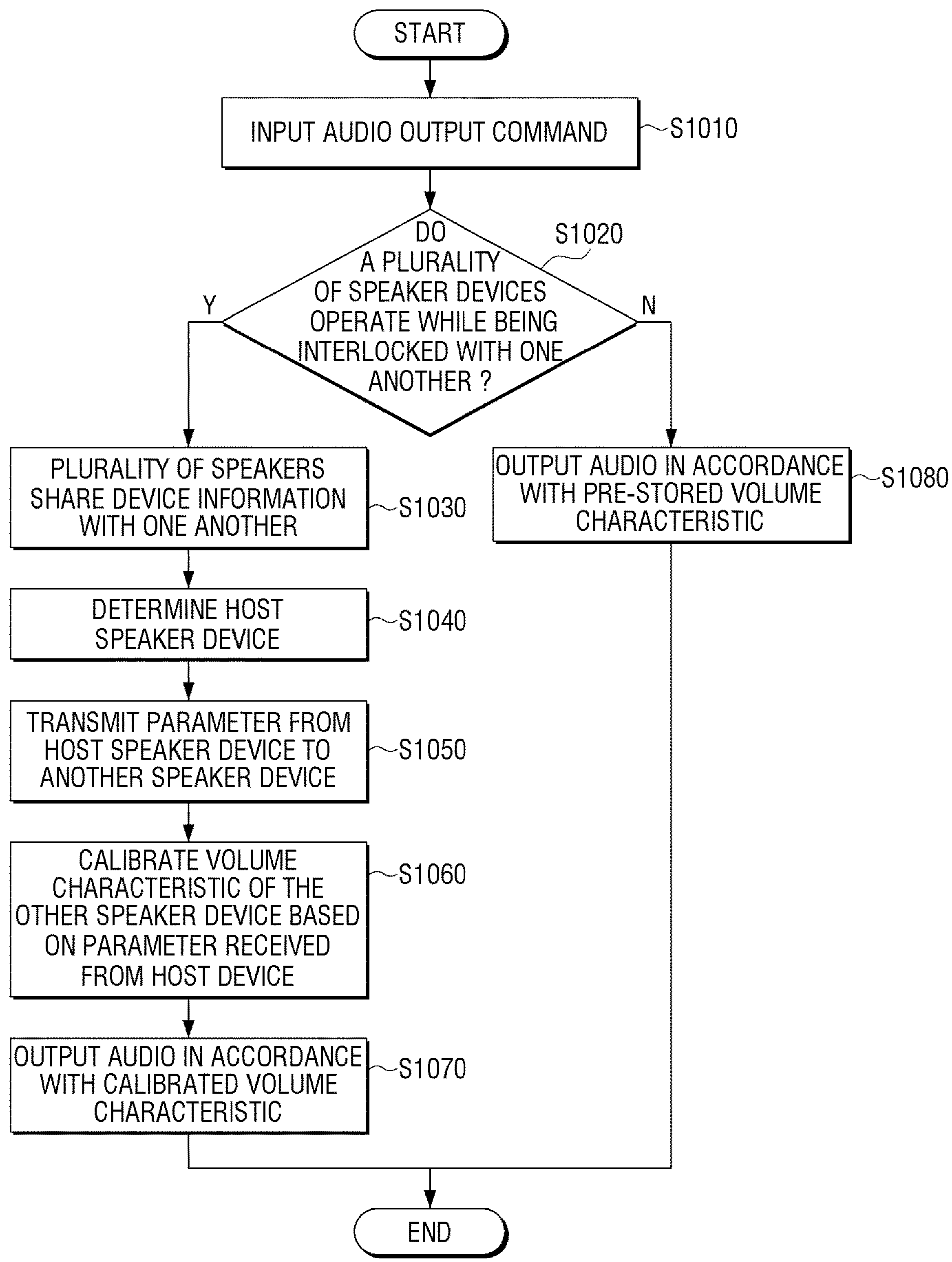
FIG. 10 is a flowchart illustrating an example volume control method in an audio output system according to an example embodiment of the present disclosure.

FIG. 10 is a flowchart illustrating an example volume control method in an audio output system according to an example embodiment of the present disclosure.

According to FIG. 10, a command for outputting audio may be input in an audio output system (S1010). For example, the plurality of speaker devices configuring the audio output system may be connected to a network.

It may be identified whether the plurality of speaker devices configuring the audio output system operate while the speaker devices are interlocked with one another (S1020). For example, it may be identified whether the plurality of speaker devices are connected with one another via the same network, or whether a user has grouped the plurality of speaker devices to operate while the speaker devices are interlocked with one another, etc.

When the plurality of speaker devices operate while being interlocked with one another (S1020-Y), the plurality of speaker devices may share the device information with one another (S1030). The device information may include at least one parameter which includes at least one of the information of a type, information of an arrangement position, and information of a sound pressure level of each of the plurality of speaker devices.

The audio output system may identify a host speaker device (S1040). For example, the plurality of speaker devices configuring the audio output system may identify the speaker device which satisfies a predetermined condition as a host speaker device based on the device information shared among the plurality of speaker devices. The method for determining the host speaker device may be described in greater detail below with reference to FIG. 11.

The identified host speaker device may transmit to another speaker device the parameter which affects the volume characteristic of the host speaker device (S1050). The other speaker device may be referred to as a slave speaker device. For example, the host speaker device may transmit at least one parameter to the other speaker device for the volume characteristic of the other speaker device to be consistent with the volume characteristic of the host speaker device.

The other speaker device may calibrate the volume characteristic of the speaker device based on the at least one parameter received from the host speaker device (S1060). For example, the other speaker device may calibrate the volume characteristic, such as a volume curve, an output power level, a sound pressure level, etc., to be consistent with the volume characteristic of the host speaker device. The method for calibrating a volume characteristic will be described in greater detail with reference to FIG. 12.

The other speaker device may output audio in accordance with the calibrated volume characteristic (S1070).

If the plurality of speaker devices operate independently from one another (S1020-N), each of the plurality of speaker devices may output audio based on a predetermined volume characteristic (S1080). For example, although it is not illustrated, the operation of storing at least one predetermined parameter which affects the volume characteristic of each of the plurality of speaker devices may be further included, and audio may be output in accordance with the unique volume characteristic of each of the plurality of speaker devices based on the at least one predetermined parameter.

According to one or more example embodiments described above, by calibrating the volume characteristic of a speaker device to be consistent with the volume characteristic of a host speaker device using at least one parameter received from the host speaker device, which affects the volume characteristic, the balance among the plurality of speaker devices may be achieved without a manual control by a user, and even if a new speaker device is added, the existing speaker devices may be compatible without changing the settings of the speaker devices, and accordingly, user convenience may improve.

Figure 11:
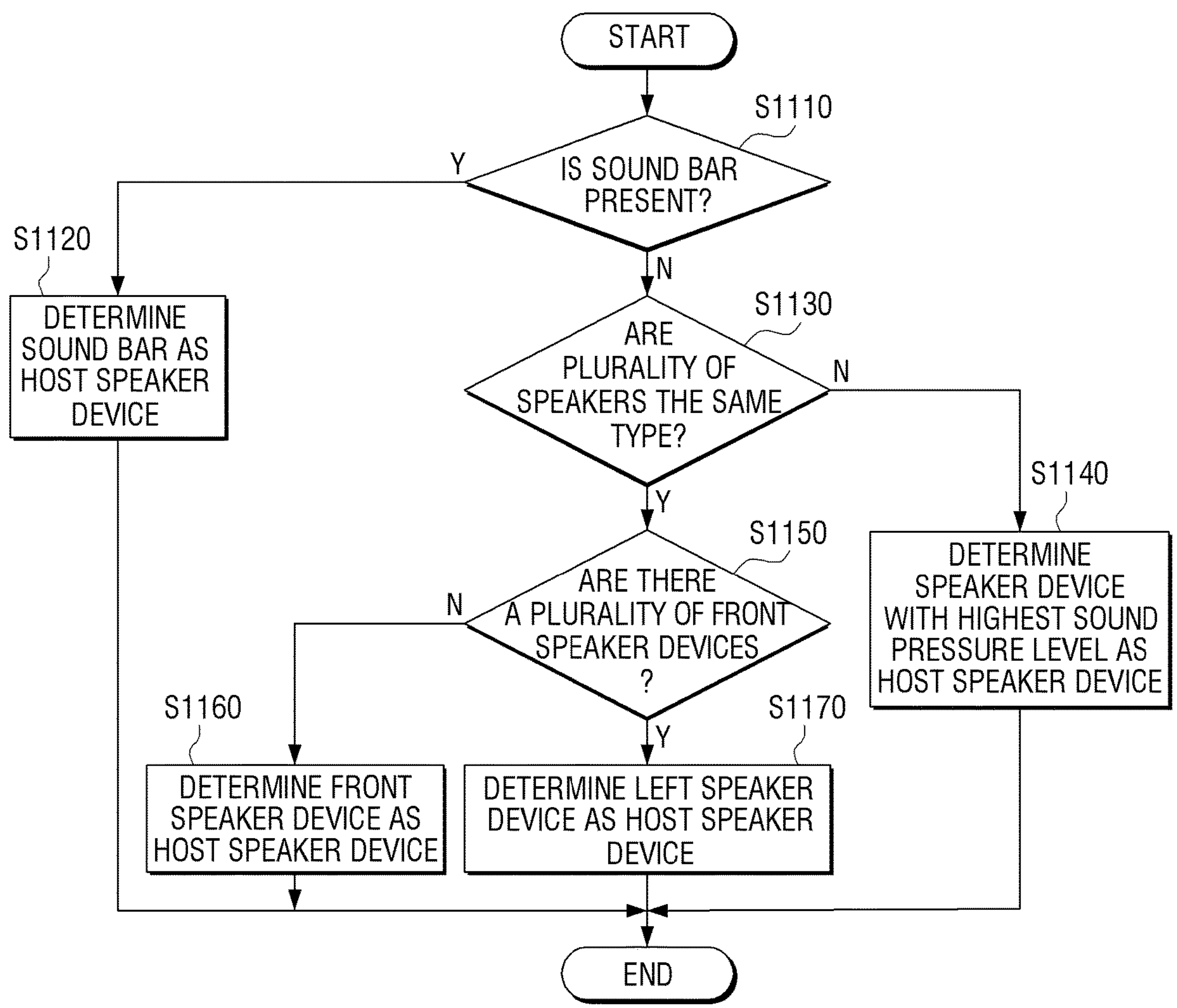
FIG. 11 is a flowchart illustrating an example method for determining a host speaker device according to an example embodiment of the present disclosure.

FIG. 11 is a flowchart illustrating an example method for determining a host speaker device according to an example embodiment of the present disclosure. For example, to identify a host speaker device, a type, a maximum sound pressure level and an arrangement position of each of a plurality of speaker devices may be sequentially compared at each volume level.

The plurality of speaker devices configuring an audio output system may identify whether there is a sound bar among the plurality of speaker device which operate while being interlocked with one another using the information of a type of the speaker devices included in the device information shared among the plurality of speaker devices (S1110).

If there is a sound bar among the plurality of speaker devices (S1110-Y), the audio output system may identify the speaker device which is a sound bar as a host speaker device (S1120). If there is no sound bar among the plurality of speaker devices (S1110-N), the audio output system may identify whether the plurality of speaker devices are the same type of speaker devices using the information of the type of speaker devices included in the device information shared among the speaker devices (S1130).

If the plurality of speaker devices are not the same type of speaker devices (S1130-N), the audio output system may identify the speaker device with the highest sound pressure level as a host speaker device from among the plurality of speaker devices (S1140). Also, if the plurality of speaker devices are the same type of speaker devices (S1130-Y), the audio output system may identify whether there are more than one front speaker device using the information of an arrangement position of the speaker devices included in the device information shared among the speaker devices (S1150). For example, the arrangement position information may be based on the information that is input when the speaker device is installed, the distance to a reproduction device, etc., and if the speaker devices are connected via cable, the arrangement position information may be based on the connection relation between a reproduction device and each of the speaker devices. The front speaker device may be arranged in a close distance to the reproduction device, or may be arranged in the front of a user.

If there is only one front speaker device (S1150-N), the audio output system may identify the front speaker device as a host speaker device (S1160). If there are more than one front speaker devices (S1150-Y), the audio output system may identify the left speaker device as a host speaker device among the plurality of speaker devices (S1170).

As described above, by determining a host speaker device based on a predetermined condition, the balance among a plurality of speaker devices may be adjusted with reference to the speaker device with the best volume characteristic without any manual control by a user.

The order of the operations for determining a host speaker device in the above determination method may be one example of a priority order for determining a host speaker device, and the example embodiments are not limited thereto. The priority order may be changed by a user settings.

Figure 12:
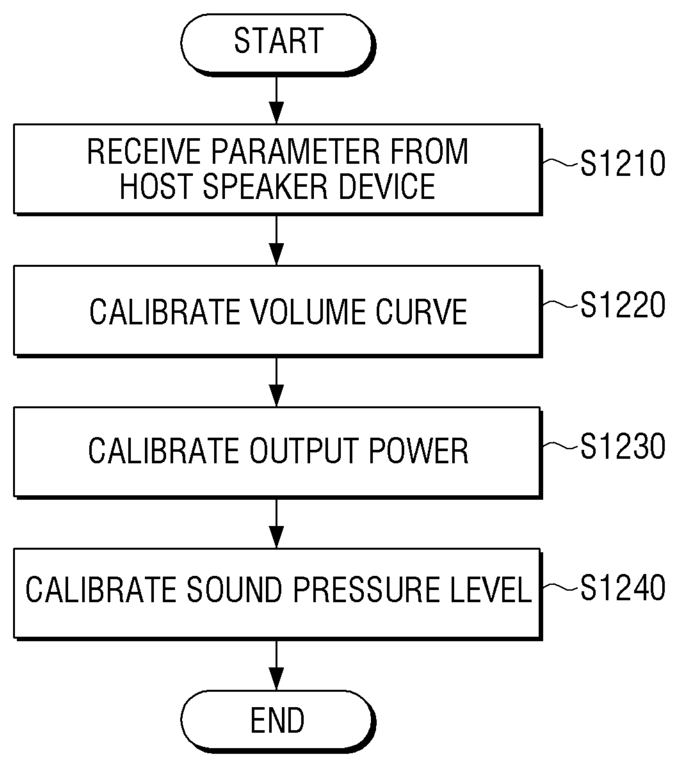
FIG. 12 is a flowchart illustrating an example method for calibrating a volume characteristic according to an example embodiment of the present disclosure.

FIG. 12 is a flowchart illustrating an example method for calibrating a volume characteristic of a speaker device according to an example embodiment of the present disclosure. FIG. 12 illustrates an example method for calibrating a volume characteristic of a speaker device in the case in which the speaker device is a slave speaker device which receives at least one parameter from a host speaker device.

According to FIG. 12, the speaker device may receive a parameter from a host speaker device (S1210). The parameter may affect the volume characteristic of a host speaker device, and may be at least one of a headroom, an input sensitivity, a maximum power level, a sound pressure level (SPL), a crossover frequency, a gain and a speaker device impedance.

The speaker device may calibrate a volume curve of the speaker device (S1220). For example, the speaker device may calibrate a volume curve of the speaker device to be consistent with the volume characteristic of the host speaker device based on at least one received parameter of the host speaker device and at least one predetermined parameter which affects the unique volume characteristic of the speaker device.

The speaker device may calibrate the output power of the speaker device (S1230). For example, the speaker device may calibrate the output power of the speaker device to be consistent with the output power of the host speaker device based on at least one received parameter of the host speaker device and at least one predetermined parameter which affects the unique volume characteristic of the speaker device.

The speaker device may calibrate a sound pressure level of the speaker device (S1240). For example, the speaker device may calibrate the sound pressure level of the speaker device to be consistent with the sound pressure level of the host speaker device based on at least one received parameter of the host speaker device and at least one predetermined parameter which affects the unique volume characteristic of the speaker device.

According to one or more example embodiments described above, by calibrating a volume characteristic of the speaker device to be consistent with a volume characteristic of the host speaker device using at least one parameter which affects a volume characteristic, which is received from the host speaker device, the balance among the plurality of speaker devices may be achieved without a manual control by a user, and even if a new speaker device is added, the existing speaker devices may be compatible without changing the settings of the speaker devices, and accordingly, user convenience may improve.

The various example embodiments described above may be implemented in a recording medium which a computer or a device similar to a computer can read using software, hardware or any combination thereof. The various example embodiments described in the specification may be embodied using at least one of a dedicated processor, a CPU, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing other functions. In some cases, the example embodiments described in the present disclosure may be implemented as a processor 120 itself. According to the software-wise implementation, the example embodiments such as the procedures and functions described in the present disclosure may be implemented as separate software modules. Each of the software modules may perform equal to or more than one function and operation described in the present disclosure.

The aforementioned control method of the sound output system may be stored on a non-transitory readable medium. The non-transitory readable medium may be provided in various apparatuses.

A computer readable recording medium may refer to a machine-readable medium or device that stores data. The aforementioned applications or programs may be stored in a non-transitory computer readable medium such as, for example, and without limitation, a compact disc (CD), a digital versatile disc (DVD), a hard disk, a Blu-ray disc, a universal serial bus (USB) stick, a memory card, a ROM, or the like.

The foregoing example embodiments and advantages are merely examples and are not to be construed as limiting the example embodiments. The description of the example embodiments is intended to be illustrative, and not to limit the scope of the disclosure, as defined by the appended claims, and many alternatives, modifications, and variations will be apparent to those skilled in the art.

What is claimed is:

1. An audio output system comprising:

a first speaker device configured to output audio based on a first volume characteristic; and a second speaker device configured to output audio based on a second volume characteristic;

wherein the first speaker device and the second speaker device are configured to share device information with each other based on the first and the second speaker device being paired with each other, and the audio output system is configured to identify a host speaker device which satisfies a predetermined condition based on the shared device information from among the first and second speaker devices, wherein the identified host speaker device is configured to calibrate the volume characteristics of the other among the first and second speaker devices by transmitting at least one parameter which affects a volume characteristic of the host speaker device to the other speaker device so that a volume characteristic of the other speaker device is consistent with a volume characteristic of the host speaker device; and wherein the other speaker device is configured to calibrate output power of the other speaker device to maximum output power of the other speaker device based on output power of the host speaker device being equal to or greater than the maximum output power of the other speaker device.

2. The audio output system of claim 1, wherein the device information comprises at least one of: information of a type of a speaker device, information of an arrangement position of a speaker device, and information of a sound pressure level of a speaker device.

3. The audio output system of claim 2, wherein the audio output system is configured to identify the host speaker device by sequentially comparing a type, a maximum sound pressure level, and an arrangement position of the first speaker device and the second speaker device.

4. The audio output system of claim 1, wherein the other speaker device is configured to obtain a difference in a volume curve of the host speaker device and a volume curve of the other speaker device using at least one parameter received from the host speaker device, and to calibrate a volume curve of the other speaker device using the obtained difference.

5. The audio output system of claim 4, wherein the other speaker device is configured to obtain a difference in output power at each volume level of the host speaker device and the other speaker device using at least one parameter received from the host speaker device, and to calibrate output power of the other speaker device using the obtained difference.

6. The audio output system of claim 5, wherein the other speaker device is configured to obtain a difference in a sound pressure level of the host speaker device and the other speaker device at same output power using at least one parameter received from the host speaker device, and to calibrate a sound pressure level of the other speaker device using the obtained difference.

7. The audio output system of claim 1, wherein the at least one parameter includes at least one of: a headroom, an input sensitivity, a maximum power level, a sound pressure level (SPL), a crossover frequency, a gain and a speaker impedance.

8. The audio output system of claim 1, wherein the other speaker device is configured to store at least one parameter which affects a volume characteristic of the other speaker device, and the other speaker device is configured to output audio based on a volume characteristic based on the at least one stored parameter when the other speaker device operates independently from the host speaker device.

9. The audio output system of claim 1, wherein the first speaker device is configured to communicate with the second speaker device via a wireless network.

10. A method of controlling volume of an audio output system comprising:

sharing, by a first speaker device and a second speaker device paired with each other, device information of the first speaker device and the second speaker device, the first speaker device configured to output audio based on a first volume characteristic and the second speaker device configured to output audio based on a second volume characteristic; and identifying a host speaker device which satisfies a predetermined condition based on the shared device information from among the first and second speaker devices;

wherein the identified host speaker device calibrates the volume characteristics of the other among the first and second speaker devices by transmitting at least one parameter which affects a volume characteristic of the host speaker device to the other speaker device so that a volume characteristic of the other speaker device is consistent with a volume characteristic of the host speaker device; and the other speaker device calibrating output power of the other speaker device to maximum output power of the other speaker device based on output power of the host speaker device being equal to or greater than the maximum output power of the other speaker device.

11. The method of claim 10, wherein the device information comprises at least one of: information of a type of a speaker device, information of an arrangement position of a speaker device, and information of a sound pressure level of a speaker device.

12. The method of claim 11, wherein the host speaker device is identified by sequentially comparing a type, a maximum sound pressure level, and an arrangement position of the first speaker device and the second speaker device.

13. The method of claim 10, wherein the other speaker device obtains a difference in a volume curve of the host speaker device and a volume curve of the other speaker device using at least one parameter received from the host speaker device, and calibrates a volume curve of the other speaker device using the obtained difference.

14. The method of claim 13, wherein the other speaker device obtains a difference in output power at each volume level of the host speaker device and the other speaker device using at least one parameter received from the host speaker device, and calibrates output power of the other speaker device using the obtained difference.

15. The method of claim 14, wherein if output power of the host speaker device is equal to or greater than maximum output power of the other speaker device, the other speaker device calibrates output power of the other speaker device to maximum output power.

16. The method of claim 14, wherein the other speaker device obtains a difference in a sound pressure level of the host speaker device and the other speaker device at same output power using at least one parameter received from the host speaker device, and calibrates a sound pressure level of the other speaker device using the obtained difference.

17. The method of claim 10, wherein the at least one parameter includes at least one of: a headroom, an input sensitivity, a maximum power level, a sound pressure level (SPL), a crossover frequency, a gain and a speaker device impedance.

18. The method of claim 10, wherein the other speaker device stores at least one of parameter which affects a volume characteristic of the other speaker device, and the other speaker device outputs audio according to a volume characteristic based on the at least one stored parameter when the other speaker device operates independently from the host speaker device.

19. The method of claim 10, wherein the first speaker device communicates with the second speaker device via a wireless network.

* * * * *